US010026482B2

(12) United States Patent
Yamauchi

(10) Patent No.: US 10,026,482 B2
(45) Date of Patent: Jul. 17, 2018

(54) SEMICONDUCTOR MEMORY DEVICE, ERASING METHOD AND PROGRAMING METHOD THEREOF

(71) Applicant: Winbond Electronics Corp., Taichung (TW)

(72) Inventor: Kazuki Yamauchi, Kanagawa (JP)

(73) Assignee: Winbond Electronics Corp., Taichung (TW)

(*) Notice: Subject to any disclaimer, the term of this patent is extended or adjusted under 35 U.S.C. 154(b) by 15 days.

(21) Appl. No.: 15/239,763

(22) Filed: Aug. 17, 2016

(65) Prior Publication Data

US 2017/0229184 A1 Aug. 10, 2017

(30) Foreign Application Priority Data

Feb. 9, 2016 (JP) .................................. 2016-022322

(51) Int. Cl.
*G11C 16/14* (2006.01)
*G06F 11/10* (2006.01)
(Continued)

(52) U.S. Cl.
CPC .......... *G11C 16/14* (2013.01); *G06F 11/1068* (2013.01); *G11C 16/10* (2013.01);
(Continued)

(58) Field of Classification Search
CPC ......... G11C 16/14; G11C 16/26; G11C 29/44; G11C 11/1068; G11C 16/10; G11C 16/16; G11C 16/3445; G11C 29/52
See application file for complete search history.

(56) References Cited

U.S. PATENT DOCUMENTS 6,870,771 B2 * 3/2005 Tomoeda ............... G11C 16/14
 365/185.22
7,286,400 B2 10/2007 Kojima et al.
(Continued)

FOREIGN PATENT DOCUMENTS

EP 3139386 A1 * 3/2017 ......... G11C 16/0483
JP 2006079695 3/2006
(Continued)

OTHER PUBLICATIONS

"Office Action of Taiwan Counterpart Application," dated Jul. 11, 2017, p. 1-p. 6.
(Continued)

*Primary Examiner* — Shelly A Chase
(74) *Attorney, Agent, or Firm* — JCIPRNET

(57) ABSTRACT

A semiconductor memory device, an erasing method and a programming method are provided. The semiconductor memory device includes a memory array, which includes a plurality of NAND strings; a page buffer/sensing circuit, which is connected to the NAND strings of the memory array through bit lines and outputs whether the NAND strings include failures; and a detecting circuit, which is connected to the plurality of page buffer/sensing circuits and detects a number of the failures among the NAND strings of a selected block. The block is determined to be usable when the number of the failures among the NAND strings detected by the detecting circuit is less than or equal to a fixed number, and the block is determined to be unusable as a bad block when the number of the failures exceeds the fixed number.

13 Claims, 8 Drawing Sheets

(51) Int. Cl.
    *G11C 16/26*     (2006.01)
    *G11C 16/34*     (2006.01)
    *G11C 29/44*     (2006.01)
    *G11C 16/10*     (2006.01)
    *G11C 16/16*     (2006.01)
    *G11C 16/04*     (2006.01)
    *G11C 29/52*     (2006.01)
    *G11C 7/20*     (2006.01)
    *G11C 29/42*     (2006.01)
    *G11C 29/04*     (2006.01)

(52) U.S. Cl.
    CPC .............. *G11C 16/16* (2013.01); *G11C 16/26* (2013.01); *G11C 16/3445* (2013.01); *G11C 16/3459* (2013.01); *G11C 29/44* (2013.01); *G11C 7/20* (2013.01); *G11C 16/0483* (2013.01); *G11C 29/42* (2013.01); *G11C 29/52* (2013.01); *G11C 2029/0409* (2013.01)

(56) References Cited

U.S. PATENT DOCUMENTS

| | | | |
|---|---|---|---|
| 9,070,460 B2 | 6/2015 | Yano | |
| 9,196,366 B2 * | 11/2015 | Yano | ...................... G11C 16/14 |
| 2007/0109857 A1 | 5/2007 | Kojima | |
| 2013/0332769 A1 | 12/2013 | Parat et al. | |

FOREIGN PATENT DOCUMENTS

| | | |
|---|---|---|
| JP | 2008004264 | 1/2008 |
| JP | 2012169020 | 9/2012 |
| JP | 2014078308 | 5/2014 |

OTHER PUBLICATIONS

"Office Action of Korea Counterpart Application," dated Jul. 20, 2017,with English translation thereof, p. 1-p. 9.

"Office Action of Taiwan Counterpart Application," dated Dec. 14, 2017, p. 1-p. 7.

* cited by examiner

SEMICONDUCTOR MEMORY DEVICE, ERASING METHOD AND PROGRAMING METHOD THEREOF

CROSS-REFERENCE TO RELATED APPLICATION

This application claims the priority benefit of Japan application serial no. 2016-022322, filed on Feb. 9, 2016. The entirety of the above-mentioned patent application is hereby incorporated by reference herein and made a part of this specification.

BACKGROUND OF THE INVENTION

1. Field of the Invention

The invention relates to a semiconductor memory device, and more particularly, to an NAND flash memory for programming and erasing.

2. Description of Related Art

In a programming operation of a flash memory, electrons are accumulated at a floating gate to shift a threshold voltage of a memory cell in a positive direction. In an erasing operation, electrons are released from the floating gate to shift the threshold voltage of the memory cell in a negative direction. The programming and erasing operations must be performed by controlling threshold values of the memory cells to fall within distribution ranges of "0" and "1". Also, whether the programming and erasing operations are qualified are determined through a programming verification and an erasing verification (Patent Document 1).

PRIOR ART DOCUMENT

Patent Document

Patent Document 1: Japanese Patent Publication No. 2014-78308

Problems to be Solved by the Invention

FIG. 1 is a flowchart of an erasing operation of a conventional flash memory. An erasing pulse is applied to a selected block (S10). Next, an erasing verification is performed on the selected block (S20). In the erasing verification, a verification voltage is applied to all the word lines of the selected block, so as to determine whether all the bit lines are qualified. Generally, in order to reduce power consumption, the erasing verification is a reverse reading that reads by supplying a Vcc voltage from a common source line to each NAND string of the selected block. If the threshold values of all the memory cells in the NAND string are within the distribution of "1", the NAND string is turned on and the bit line is at a high potential (H potential). As long as the threshold value of one memory cell is not within the distribution of "1", the NAND string is not turned on and the bit line is at a low potential (L potential). Accordingly, if all the bit lines of the selected block are the H potential, the selected block is determined as qualified (S30) and the erasing operation ends. If any one of the bit lines is at the L potential, the selected block is determined as unqualified, and whether a number of times of applying the erasing pulse reaches NMAX is determined (S40). Here, NMAX refers to a permissible maximum number of times of applying the erasing pulse in the erasing operation. If NMAX is reached, an external controller is informed of a status of erasing failure, and the block is managed as a bad block. If the NMAX is not reached, an erasing pulse having a step voltage greater than the previous erasing pulse by $\Delta V$ is generated according to ISPE (Incremental Step erasing pulse) (S50), and such erasing pulse is then applied to the selected block.

FIG. 2 is a diagram of a determination circuit in a conventional erasing verification. For example, when the size of a page buffer/sensing circuit is 2 kB, a verification transistor with nodes $SLS\_0$, $SLS\_1$, $SLS\_2$, . . . , $SLS\_2048 \times 8$ respectively connected to a latch circuit is connected in parallel between a verification and determination line VL and a node N, and a transistor for enabling the verification (JUDGEON at the H potential) is further connected between the node N and GND. In the erasing verification, a voltage at the H potential is supplied to the verification and determination line VL. If the erasing verification is qualified, all the bits are at the H potential, all the nodes $SLS\_0$, $SLS\_1$, $SLS\_2$, . . . , $SLS\_2048 \times 8$ of the latch circuit become the L potential and the verification and determination line VL maintains at the H potential. Alternatively, if the erasing verification is unqualified, any one of the nodes $SLS\_0$, $SLS\_1$, $SLS\_2$, . . . , $SLS\_2048 \times 8$ becomes the H potential, the corresponding verification transistor is turned on, and the verification and determination line VL becomes the L potential.

As described above, the conventional erasing verification is to detect whether all NAND strings are turned on. As long as the block includes only one NAND string that is not turned on, the block is managed as the bad block. In the erasing verification, the possible reasons why the NAND strings have failures include manufacture defect of the memory cells, performance degradation on the memory cells after being repeatedly programmed/erased and so on. However, the increasing number of the bad blocks can reduce a yield rate of the flash memory or reduce a utilization efficiency of the memory array.

SUMMARY OF THE INVENTION

The invention aims to solve conventional problem as mentioned above by providing a semiconductor storage device which is capable of improving the yield rate and thereby improving the utilization efficiency of the memory array.

Technical Means for Solving the Problem

An erasing method of semiconductor storage device of the invention includes the following steps: applying an erasing pulse to a selected block; detecting a number of failures among NAND strings of the selected block when the selected block is unqualified in an erasing verification and a number of times of applying the erasing pulse reaches a predetermined number of times; and completing the erasing in a state of the selected block to be usable when the number of the failures among the NAND strings is less than or equal to a fixed number, and managing the selected block to be unusable as a bad block when the number of the failures exceeds the fixed number.

Preferably, the fixed number is less than or equal to a number of bits correctable through an error checking/correcting process.

A programming method of semiconductor storage device of the invention includes the following steps: detecting a number of failures among NAND strings of a selected block; determining a permissible number of unqualified bits in a programming verification based on the number of the failures among the NAND strings being detected; applying a programming pulse to a selected page of the selected block; and performing the programming verification on the selected page based on the permissible number of unqualified bits.

Preferably, the permissible number of unqualified bits is less than or equal to a number of bits correctable through an error checking/correcting process. Preferably, the permissible number of unqualified bits correspondingly decreases when the number of the failures among the NAND strings increases. Preferably, the programming verification is determined as suspectedly qualified when the selected page having a number of bits with programming failure less than or equal to the permissible number of unqualified bits. Preferably, the step of detecting the number of the failures among the NAND strings includes performing a step of reverse reading, wherein the step of reverse reading is to read by applying a voltage from a common source line of the selected block to the NAND strings. Preferably, the programming method further include: performing an error checking/correcting process on data to be programmed, and correcting an error caused by the failures among the NAND strings through the error checking/correcting process when reading the data.

A semiconductor memory device of the invention includes: a memory array, which includes a plurality of NAND strings; an output circuit, connected to the NAND strings of the memory array through a bit line, and outputting whether the NAND strings include failures; and a detecting circuit, connected to a plurality of the output circuits, and detecting a number of the failures among the NAND strings of a selected block.

Preferably, the detecting circuit includes: a first circuit, generating a plurality of detection voltages corresponding to whether the NAND strings include the failures outputted by the plurality of the output circuits; a second circuit, generating a reference voltage; and a comparison circuit, comparing the detection voltages with the reference voltage, and the comparison circuit detecting the number of the failures among the NAND strings connected to the plurality of the output circuits. Preferably, the semiconductor storage device further includes: a reverse reading circuit for performing a reverse reading on the plurality of NAND strings of the selected block by applying a voltage from a common source line of the selected block to the NAND strings and applying a verification voltage to all pages of the selected block, wherein the output circuit outputs whether the NAND strings include the failures based on a read result of the reverse reading circuit. Preferably, the semiconductor storage device further includes: an erasing circuit for erasing the selected block. When the selected block is unqualified in an erasing verification and a number of times of applying an erasing pulse reaches a predetermined number of times, the erasing circuit completes the erasing in a state of the selected block to be usable when the number of the failures among the NAND strings is less than or equal to a fixed number, and the erasing circuit manages the selected block to be unusable as a bad block when the number of the failures exceeds the fixed number. Preferably, the semiconductor storage device further includes: a programming circuit for programming a selected page of the selected block. The programming circuit performs a programming verification on the selected page based on a permissible number of unqualified bits. The permissible number of unqualified bits is set based on the number of the failures among the NAND strings detected by the detecting circuit. Preferably, the semiconductor storage device further includes: an error checking/correcting circuit for performing an error checking/correcting process on data to be programmed and data read from the memory array, wherein the permissible number of unqualified bits is less than or equal to a number of bits correctable by the error checking/correcting circuit. Preferably, the output circuit includes a page buffer/sensing circuit.

Effect of the Invention

According to the invention, by detecting the number of the failures among the NAND strings in the selected block, the block including the failures less than or equal to the fixed number may be realized as being usable. Further, according to the invention, the number of unqualified bits to be determined as suspectedly qualified may be determined in correspondence with the number of the failures among NAND strings being detected. Accuracy of determination of suspectedly qualified may be ensured by excluding the error occurred in the data due to erasing failure of the NAND strings from the error caused by programming failure during the programming, so that the block having the failures in only a part of NAND strings may still be programmed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
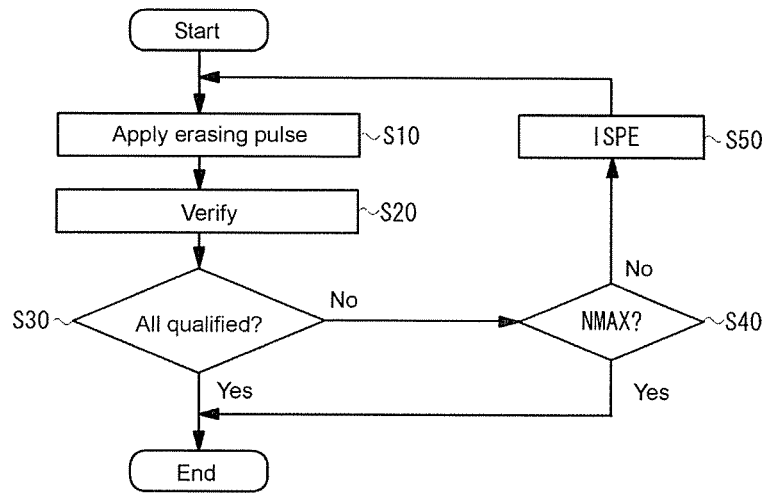
FIG. 1 is a flowchart illustrating an erasing operation of a conventional flash memory.
Figure 2:
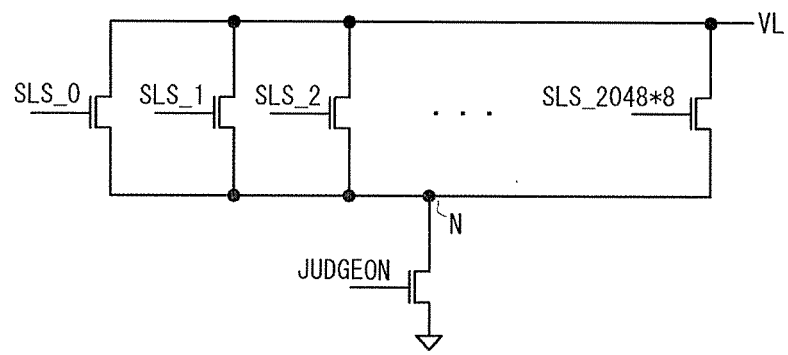
FIG. 2 is a diagram of a determination circuit in a conventional erasing verification.

Reference will now be made in detail to the present preferred embodiments of the invention, examples of which are illustrated in the accompanying drawings. Wherever possible, the same reference numbers are used in the drawings and the description to refer to the same or like parts.

In the following, details of the embodiments of the invention will be described with reference to the accompany drawings. Here, an NAND flash memory is illustrated as the preferred embodiment. In addition, it should be noted that respective parts are exaggerated to emphasize in the accompanied drawings to facilitate understanding, and the scales of the respective parts are different from the scales of the actual components.

Embodiments

Figure 3:
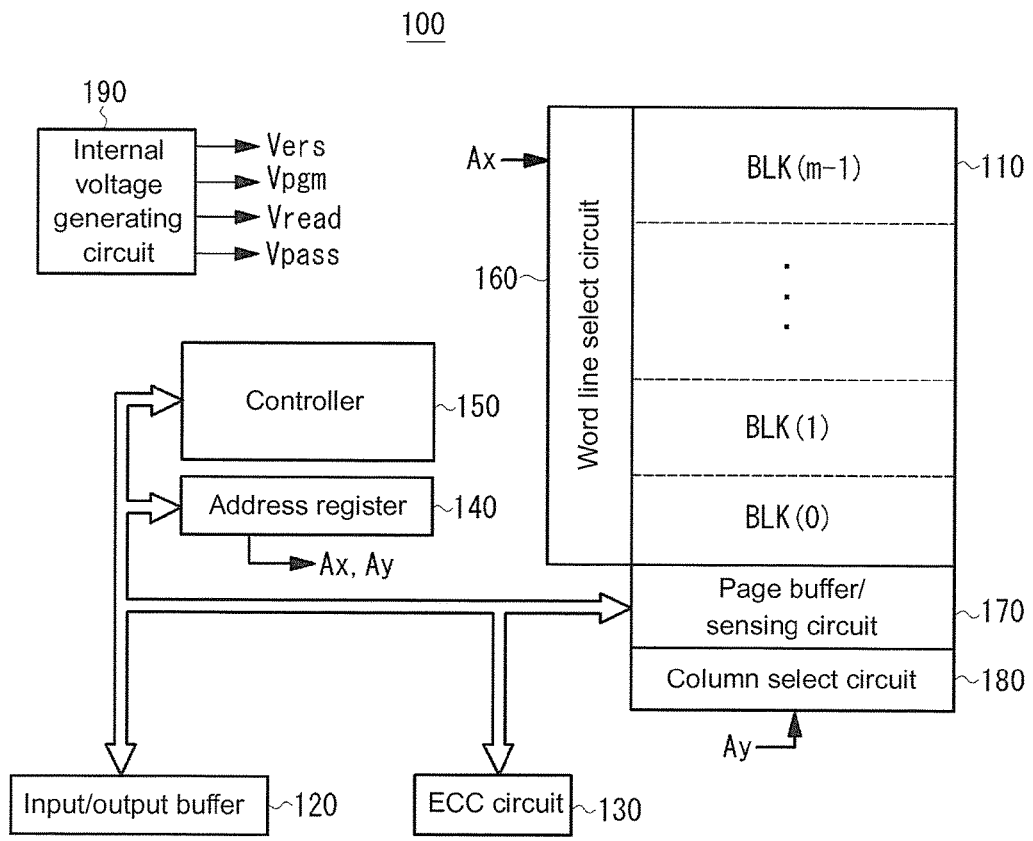
FIG. 3 is a general schematic diagram illustrating an NAND flash memory according to an embodiment of the invention.

A typical structure of the flash memory according to an embodiment of the invention is shown in FIG. 3. However, the structure of the flash memory shown herein is merely an example, and the invention is not necessarily limited to such structure. A flash memory 100 of the present embodiment includes the following components and exhibits a configuration as described below. A memory array 110, in which a plurality of memory cells are arranged in array, is provided. An input/output buffer 120 is connected to an external input/output terminal I/O to hold input/output data. An ECC circuit 130 is provided to perform an error checking/correcting process on data programmed in the memory array 110 and data read from the memory array 110. An address register 140 is provided to receive address data from the input/output buffer 120. A controller 150 is provided to receive command data from the input/output buffer 120 or an external control signal to control the respective parts. A word line select circuit 160 is provided to receive row address information Ax from the address register 140, decode the row address information Ax, and select a block and a word line based on a decoding result. A page buffer/sensing circuit 170 is provided to hold data read from a page selected by the word line select circuit 160, or hold data to be written to the selected page. A column select circuit 180 is provided to receive column address information Ay from the address register 140, decode the column address information Ay, and select data in the page buffer/sense circuit 170 based on a decoding result. An internal voltage generating circuit 190 is also provided to generate various voltages (a write voltage Vpgm, a pass voltage Vpass, a read pass voltage Vread, an erase voltage Vers, etc.) required for reading, programming and erasing data.

Figure 4:
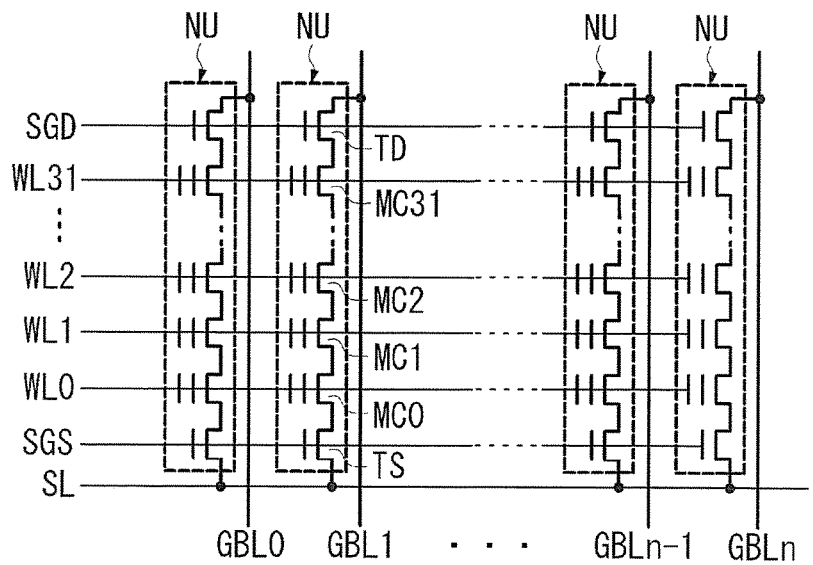
FIG. 4 is a circuit diagram illustrating a structure of an NAND string of a memory cell array according to an embodiment of the invention.

The memory array 110 has m storage blocks BLK(0), BLK(1), . . . , and BLK(m−1) disposed along a column direction. The page buffer/sensing circuit 170 is disposed near the block BLK(0). In one storage block, as shown in FIG. 4, a plurality of NAND string units NU each formed by a plurality of memory cells connected in series are formed, and n+1 strings NU are arranged along a row direction in the storage block. The string unit NU includes: a plurality of memory cells MCi (i=0, 1, . . . , 31) connected in series; a select transistor TD connected to a drain side of the memory cell MC31 served as an end; and a select transistor TS connected to a source side of the memory cell MC0 served as another end. A drain of the select transistor TD is connected to one corresponding bit line among bit lines GBL0 to GBLn, and a source of the select transistor TS is connected to a common source line SL.

A control gate of the memory cell MCi is connected to a word line WLi, and gates of the select transistor TD and the select transistor TS are connected to a select gate line SGD and a select gate line SGS arranged in parallel with the word line WLi. When the word line select circuit 160 selects the block based on the row address information Ax or converted address information, the select transistor TD and the select transistor TS are selectively driven through the select gate line SGS and the select gate line SGD of the block. FIG. 4 illustrates a typical structure of the string unit. However, for the string unit, one or more dummy cell may be included in the NAND string.

Generally, the memory cell typically includes a MOS (Metal Oxide Semiconductor) structure, and the MOS structure includes: source/drain served as a N-type diffusion region and formed inside a P-well; a tunneling oxide film formed on a channel between the source/drain; a floating gate (a charge accumulation layer) formed on the tunneling oxide film; and a control gate formed on the floating gate by a dielectric film. When the charges are not accumulated in the floating gate (i.e., when data "1" is written), the threshold value is negative and the memory cell is "normally on". When the charges are accumulated in the floating gate (i.e., when data "0" is written), the threshold value is shifted into positive, and the memory cell is "normally off". Nevertheless, the memory cell may be a SLC (Single Level Cell) type that stores 1 bit (binary data), and may also be a MLC (Multi Level Cell) type that stores multiple bits.

Table 1 is a table illustrating an example where a bias voltage is applied in respective operations of the flash memory. In a reading operation, a positive voltage is applied to the bit line, a voltage (e.g., 0 V) is applied to the selected word line, the pass voltage Vpass (e.g., 4.5 V) is applied to a non-selected word line, a positive voltage (e.g., 4.5 V) is applied to the select gate lines SGD and the select gate line SGS to turn on the bit line side select transistor TD and the source line side select transistor TS, and 0 V is applied to the common source line. In a programming (writing) operation, the program voltage Vpgm at the high potential (15 V to 20 V) is applied to the selected word line, and an intermediate potential (e.g., 10 V) is applied to the non-selected word line to turn on the bit line side select transistor TD, turn off the source line side select transistor TS, and supply a potential corresponding to the data "0" or "1" to the bit line GBL. In an erasing operation, 0 V is applied to the selected word line in the block, a high voltage (e.g., 21 V) is applied to the P-well to extract electrons of the floating gate to a substrate, so as to erase data using block as a unit.

TABLE 1

|  | Erasing | Writing | Reading |
| --- | --- | --- | --- |
| Selected word line | 0 | 15~20 V | 0 |
| Non-selected word line | F | 10 V | 4.5 |
| SGD | F | Vcc | 4.5 |
| SGS | F | 0 | 4.5 |
| SL | F | Vcc | 0 |
| P-well | 21 | 0 | 0 |

In the programming operation, when input data Di (data to be programmed) are loaded to the page buffer/sensing circuit 170 through the input/output buffer 120, the ECC circuit 130 performs computation on the input data Di transmitted from the page buffer/sensing circuit 170, so as to generate an error correcting code and a parity bit required by the error checking/correcting process for the programmed data. The ECC computation is performed by using conventional processes, such as Hamming code or Reed-Solomon, to convert the input data Di of k bits or k bytes in a manner of p=k+q. Here, "q" is the error correcting code or the parity bit required by the error checking/correcting process on the input data Di. In a preferred embodiment, the ECC circuit 130 sets the error correcting code to a spare area of the page buffer/sensing circuit 170. In this way, the input data Di and the error correcting code set in the page buffer/sensing circuit 170 may be programmed in the selected page of the memory array 110.

In the reading operation, when the data read from the selected page of the memory array 110 is held by the page buffer/sensing circuit 170, the ECC circuit 130 performs the error checking on the read data based on the error correcting code transmitted from the page buffer/sensing circuit 170. If an error is detected, the corrected data is set in the page buffer/sensing circuit 170. Further, the data held by the page buffer/sensing circuit 170 is outputted through the input/output buffer 120.

Figure 5:
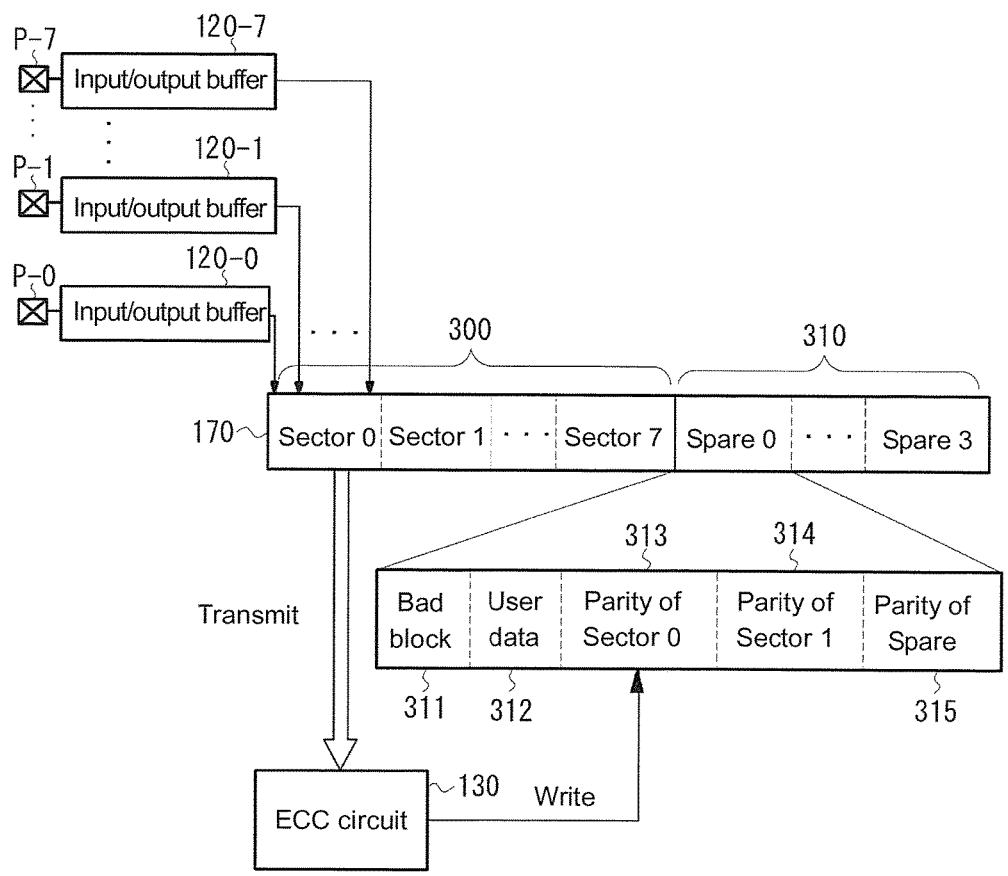
FIG. 5 is a diagram illustrating an ECC process on a normal area in the programming operation according to an embodiment of the invention.

An example of the ECC process is illustrated in FIG. 5. When the controller 150 receives a program command via the input/output buffer 120, a sequence for programming starts. When the flash memory 100 has eight external input/output terminals, the input data Di are loaded from external input/output terminals P-0 to P-7 to the page buffer/sensing circuit 170 through input/output buffers 120-1 to 120-7, respectively. The page buffer/sensing circuit 170 includes a normal area 300 divided into eight sectors, namely Sector 0 to Sector 7, and a spare area 310 divided into four sectors, namely Spare 0 to Spare 3, for example.

One sector of the normal area 300 is constituted by 256 bytes, for example. Under such circumstance, the eight sectors of the normal area can hold the programmed approximately 2 Kbytes of data in total. One sector of the spare area 310 is constituted by 16 bytes. Under such circumstance, the four sectors (Spare 0 to Spare 3) can hold 64 bytes of data in total. For example, one sector of the spare area 310 includes: an area 311 storing information for identifying a bad block containing a bad memory cell, an area 312 storing information regarding user data, an area 313 and an area 314 storing the error correcting codes (the parity bits) related to two sectors of the normal area 300, and an area 315 storing the error correcting code (the parity bit) for performing the ECC computation on the spare area 310. The area 313 and the area 314 in Spare 0 of the spare area 310 store the error correcting codes (the parity bits) of Sector 0 and Sector 1 of the normal area 300, respectively. The area 313 and the area 314 in Spare 1 of the spare area 310 store the error correcting code (the parity bits) of Sector 2 and Sector 3 of the normal area 300, respectively. Similarly, Spare 2 of the spare area 310 stores the error correcting codes (the parity bits) of Sector 4 and Sector 5 of the normal area 300, respectively. Spare 3 of the spare area 310 stores the error correcting codes (the parity bits) of Sector 6 and Sector 7 of the normal area 300, respectively.

In the normal area 300, one sector is assigned with the input/output buffers 120-0 to 120-7. Namely, 256 bits are assigned in one external input/output terminal (256 bit×8=1 sector). The column select circuit 180 decodes the column address information Ay received in the programming operation, and selects the sector loaded with data inputted from the external input/output terminal P-0 to P-7 based on a decoding result. FIG. 5 illustrates an example in which the data received from the external input/output terminal P-0 to P-7 are loaded to Sector 0 according to the column address information Ay.

In the example illustrated herein, the ECC circuit 130 includes a writing circuit for writing the error correcting code. Preferably, the ECC circuit 130 may perform the ECC computation on data with a number of bytes equal to one sector of the normal area 300. If one sector of the normal area 300 is 256 bytes, the ECC circuit may perform the ECC computation on 256 bytes of data, for example, to generate the error correcting code for correcting 1 bit of error. Under such circumstance, the eight sectors are capable of correcting 8 bits of error in total at maximum.

The ECC circuit 130 writes the generated error correcting code to the area 313 or the area 314 in the corresponding sector of the spare area 310. In the example illustrated in FIG. 5, the programmed data are loaded to Sector 0 of the normal area 300, and thus the error correcting code is written to the area 313 storing the parity of Spare 0.

Figure 6:
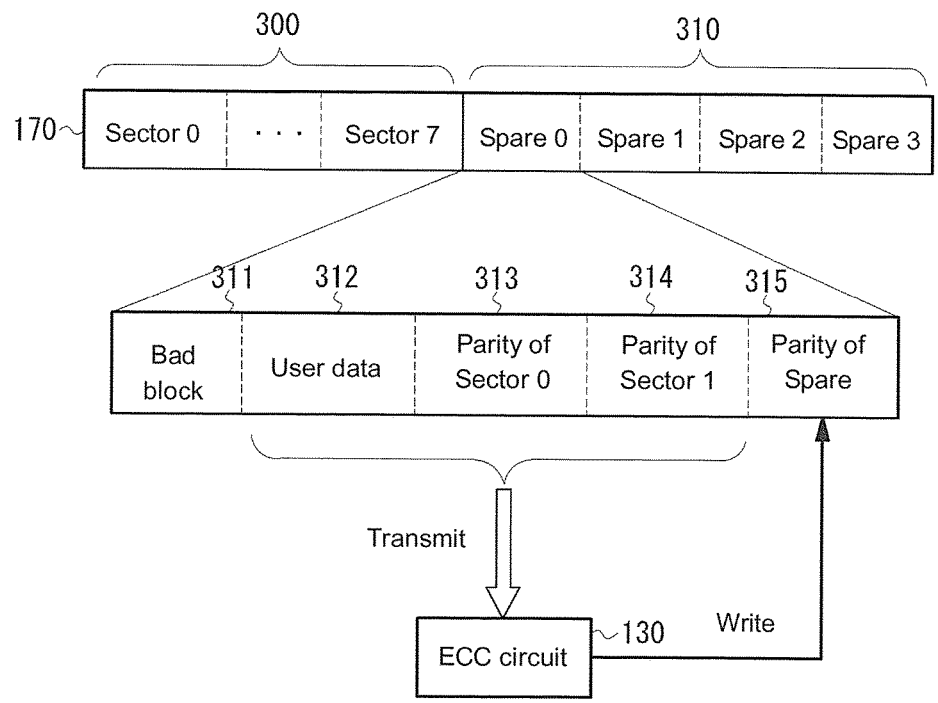
FIG. 6 is a diagram illustrating an ECC process on a spare area in programming operation according to an embodiment of the invention.

FIG. 6 illustrates the ECC process for the spare area 310. When the ECC process is completed for each sector of the normal area 300, the ECC process is then performed for each sector of the spare area 310. It is arbitrary to start performing the ECC process on any data contained in the sector in the spare area 310. However, in this embodiment, it is set to start performing the ECC process on the data in the areas 312 to 314. Thus, the data in the areas 312 to 314 in Spare 0 are transmitted to the ECC circuit 130, and the error correcting code generated by the ECC process is written to the area 315 of Spare 0 by using the ECC circuit. The same process is also performed to Spare 1 to Spare 3. When the ECC process is completed, programming of the memory array 110 starts.

In the flash memory in which the ECC circuit is mounted by the chip according to the present embodiment, or in a flash memory utilizing an ECC function powered by an external controller, etc, as long as a part of unqualified bits (the memory cells with programming failure "0") exists in a programming verification, such condition is still correctable by the ECC. For example, a maximum number of unqualified bits correctable in theory is Ncc bits if the error checking/correcting process for Ncc bits may be performed by the ECC. Under such circumstance where a scheme for determination of suspectedly qualified is used to determine unqualified bits as qualified, whether a number N of unqualified bits can be made suspectedly qualified is determined in the programming verification. When a permissible number of bits is set as Np in determination of suspectedly qualified, if N≤Np, the determination of suspectedly qualified is made (that is, in a relationship of Np≤Ncc). After determination of suspectedly qualified is completed, the programming operation ends and the unqualified bits with programming failure "0" are directly stored to the selected page. In the case of reading the selected page, the unqualified bits included in the selected page are detected as the error so the corresponding data may then corrected. By using the scheme for determination of suspectedly qualified, programming failures and bad blocks may be reduced to increase the yield rate. Thus, the programming interference may be reduced by suppressing the number of times of applying the programming pulse.

Figure 7:
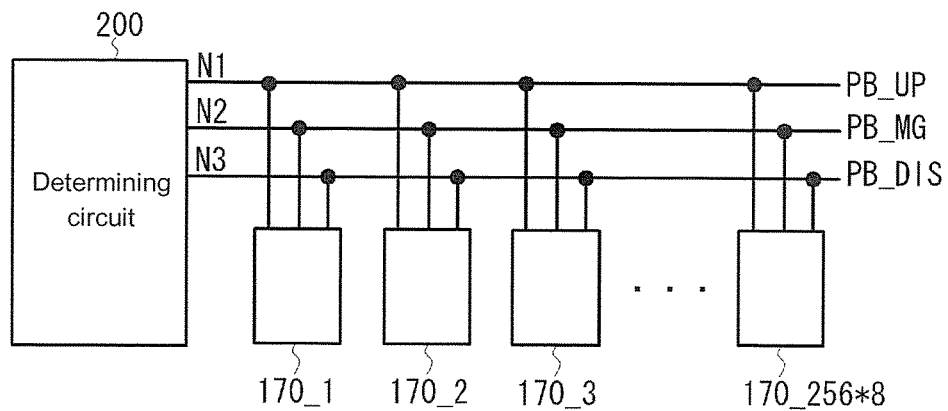
FIG. 7 is a diagram illustrating a connection relationship between the determination circuit for determination of suspectedly qualified and the page buffer/sensing circuit according to an embodiment of the invention.

Next, a determination circuit for determination of suspectedly qualified according to the present embodiment is described in the following. FIG. 7 a diagram illustrating a connection relationship between the determination circuit for determination of suspectedly qualified and the page buffer/sensing circuit. In one preferred embodiment, when the ECC process is performed using sector as a unit, one determination circuit 200 is prepared in one sector. For example, as shown in FIG. 5, when one page is divided into eight sectors and one sector is constituted by 256 bytes, one determination circuit is connected to one sector. That is to say, there are 256×8 page buffer/sensing circuits in total, including the page buffer/sensing circuit 170_1, the page buffer/sensing circuits 1702, and the page buffer/sensing circuit 170_3 to the page buffer/sensing circuit 170_256×8. Therefore, eight determination circuits are prepared in one page.

As shown in FIG. 7, the determination circuit 200 is connected to a wiring PB_UP, a wiring PB_MG and a wiring PB_DIS through a node N1, a node N2 and a node N3, respectively. The wiring PB_UP, the wiring PB_MG and the wiring PB_DIS are commonly connected in a manner of connecting the 256×8 page buffer/sensing circuits (the page buffer/sensing circuit 170_1 to the page buffer/sensing circuit 170_256×8 in parallel. For example, when performing the ECC computation on 256 bytes of data, for example, if the ECC circuit 130 is able to correct 4 bits of error at the maximum, the determination circuit 200 allows 4 bits of unqualified bits (the data "0" with programming failure) at the maximum to be determined as suspectedly qualified.

In other preferred embodiments, when the ECC process is not performed by using sector as a unit but using page as a unit, it is also possible to prepare one determination circuit in one page. Under such circumstance, one determination circuit can use a maximum number of error bits correctable by the ECC circuit as the permissible number of unqualified bits for making the determination of suspectedly qualified.

Figure 8:
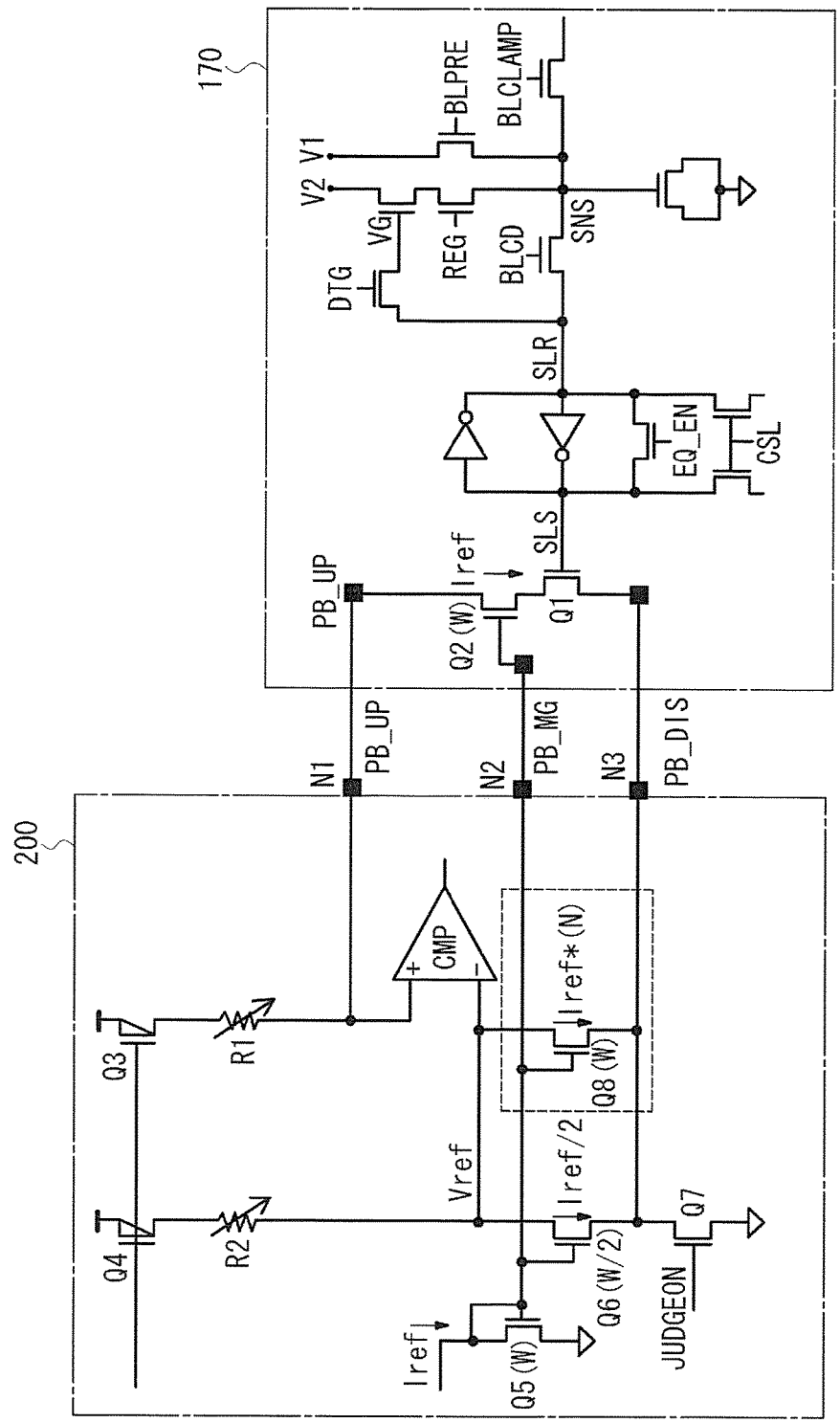
FIG. 8 is a diagram illustrating structures of the determination circuit for determination of suspectedly qualified and the page buffer/sensing circuit according to an embodiment of the invention.

Next, details of the determination circuit are described in the following. FIG. 8 illustrates a structure of one determination circuit and one page buffer/sensing circuit 170 connected thereto. Typically, the page buffer/sensing circuit 170 includes: a transistor BLPRE for pre-charging a voltage from a voltage supplier V1 to the bit line, a transistor BLCLAMP for clamping the bit line, a transistor BLCD for enabling a charge transmission between a read node SNS and a latch node SLR, a transistor DTG for transmitting a potential of the latch node SLR to a node VG of a voltage supplier V2, and a transistor REG for combining the voltage supplier V2 to a read node SNS. For example, the transistor DTG operates when it is required to invert the read node SNS from the L potential to the H potential in the programming verification. Or, other than that, the transistor DTG also operates in the case of inverting the read node SNS from the H potential to the L potential. The page buffer/sensing circuit 170 further includes a latch circuit formed by a pair of cross coupling inverters. The latch circuit includes: a transistor EQ_EN for equalizing the nodes SLR/SNS, a transistor CSL for combining the nodes SLR/SNS to a data line, a transistor Q1 combined to the node SLS, and a transistor Q2 serially connected to the transistor Q1.

The page buffer/sensing circuit 170 further includes a circuit for outputting whether the programming verification is qualified. Said circuit includes two NMOS transistors (the NMOS transistor Q1 and the NMOS transistor Q2) connected in series between the wiring PB_UP and the wiring PB_DIS. The node SLS is supplied to a gate of the transistor Q1 and the wiring PB_MG is connected to a gate of the transistor Q2. The wiring PB_UP is connected to the node N1 of the determination circuit 200, the wiring PB_MG is connected to the node N2, and the wiring PB_DIS is connected to the node N3. As explicated below, the transistor Q2 is a transistor having a size W the same as those of the transistor Q5 and the transistor Q8. When the transistor Q1 is turned on, a reference current Iref flows in the transistor Q2. When the programming verification is qualified, the latch node SLS becomes the L potential, and the transistor Q1 is turned off. No current flows from the wiring PB_UP to the wiring PB_DIS, so a voltage of the wiring PB_UP does not change. When the programming verification is unqualified, the latch node SLS becomes the H potential, and the transistor Q1 is turned on. Under such circumstance, the reference current Iref flows in the transistor Q2, so the voltage of the wiring PB_UP drops because of the reference current Iref.

The determination circuit 200 includes: a PMOS transistor Q3 and a PMOS transistor Q4 connected to voltage supply sources, a variable resistor R1, a variable resistor R2, a comparator CMP, a NMOS transistor Q5, a NMOS transistor Q6, a NMOS transistor Q7 and a NMOS transistor Q8. The PMOS transistor Q3 and the PMOS transistor Q4 function as current sources and respectively adjust the variable resistor R1 and the variable resistor R2 in a manner of making voltages outputted from the variable resistor R1 and the variable resistor R2 equal. Namely, as an initial setting, the variable resistor R1 and the variable resistor R2 are adjusted by making the voltage of the wiring PB_UP and a reference voltage Vref equal. The output of the variable resistor R1, namely the voltage of the wiring PB_UP, is connected to an input terminal (+) of the comparator CMP, and the output of the variable resistor R2, namely the reference voltage Vref, is connected to another input terminal (−) of the comparator CMP. The comparator CMP compares the two input voltages and outputs the voltage of the H potential or the L potential. The H potential indicates suspectedly qualified, and the L potential indicates unqualified.

The transistor Q5 is connected to a constant current source in which the reference current Iref flows. A gate of the transistor Q5 is connected to the node N2 to form the wiring PB_MG. The transistor Q6 is connect in series with the variable resistor R2 and has a gate connected to the node N2. The transistor Q7 is connect in series between the transistor Q6 and GND, and a JUDGEON signal is supplied to a gate of the transistor Q7. In the programming verification, the JUDGEON signal is driven to the H potential so the transistor Q7 is turned on. A connection node of the transistor Q6 and the transistor Q7 is connected to the node N3 to form the PB_DIS. Here, a size of the transistor Q6 (W/2) is half of the size of the transistor Q5 and the transistor Q2 (W). Thus, when the transistor Q7 is turned on, ½ of Iref flows in the transistor Q6.

The transistor Q8 is set in correspondence with the number N of unqualified bits for making determination of suspectedly qualified by the determination circuit 200. If the number of unqualified bits is 0 bit when making determination of suspectedly qualified by the determination circuit 200, the transistor Q8 is actually not required; or even if the transistor Q8 is disposed, operation of the transistor Q8 is still disabled (N=0). One transistor Q8 is required when making determination of suspectedly qualified for 1 bit of unqualified bits (N=1). Two transistors Q8 connected in parallel are required when the unqualified making determination of suspectedly qualified for 2 bits of unqualified bits (N=2). A maximum value of the number of unqualified bits usable for making determination of suspectedly qualified through the determination circuit 200 is a maximum number of bits correctable by the ECC circuit 130.

FIG. 8 illustrates one transistor Q8, as described above, the transistor Q8 is set in correspondence with the number N of the unqualified bits for making determination of suspectedly qualified. The transistor Q8 is connected between the reference voltage Vref and the wiring PB_DIS and has a gate connected to the wiring PB_MG. The size of the transistor Q8 (W) is identical to the size of the transistor Q5 and the transistor Q2 (W). When the transistor Q7 is turned on, the reference current Iref flows in the transistor Q8.

Figure 9:
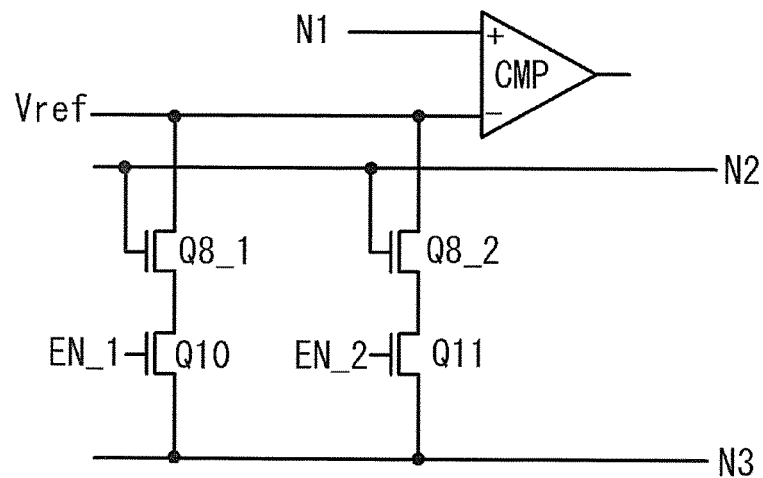
FIG. 9 is a diagram illustrating a method for selecting the number of active transistors from among the connected transistors according to an embodiment of the invention.

The transistor Q8 is prepared in correspondence with the number (N) of the unqualified bits for making determination of suspectedly qualified, and the transistors Q8 may also be connected in correspondence with the number N, so these transistors Q8 can operate together. Alternatively, it is arbitrary to select any number of the transistors Q8 for operating from among the connected transistors Q8. FIG. 9 illustrates an example for selecting the number of the transistors Q8 for operating from the connected transistors Q8. A transistor Q8_1 and a transistor Q10 are connect in series between the reference voltage Vref and the wiring PB_DIS so these transistors may be connected in parallel with a transistor Q8_2 and a transistor Q11 connected in series. An enable signal EN_1 and an enable signal EN_2 are supplied to gates of the transistor Q10 and the transistor Q11. When the enable signal EN_1 and the enable signal EN_2 are driven to the H potential, the transistor Q8_1 and the transistor Q8_2 operate in a manner that the reference current Iref flows through. By driving one of the enable signal EN_1 and the enable signal EN_2 to the L potential, one of the transistors Q8 operates in the manner that the reference current Iref flows through. By driving both of the enable signal EN_1 and the enable signal EN_2 to the L potential, none of the two transistors Q8_1 and Q8_2 operates. The enable signal EN_1 and the enable signal EN_2 are driven in response to a control signal from the controller 150, for example. Here, while it is possible to make a selection on the transistor Q8_1 and the transistor Q8_2 by switching the transistor Q10 and the transistor Q11, such arrangement also enables to more persistently fix the selected transistor Q8 by replacing transistors Q10 and Q11 with a fuse.

Next, the operation of the determination circuit 200 is described in the following. Table 2 is a table showing current values of the respective parts when unqualified bits to be determined as suspectedly qualified by the determination circuit are 0 bit, 1 bit, or 2 bits and difference of the current values.

TABLE 2

| Suspectedly qualified | Qualified or not | Iref (Vref) | Iref (PB_UP) | Δ Iref |
|---|---|---|---|---|
| 0 bit | Qualified | Iref/2 | 0 (0 bit unqualified) | +Iref/2 |
|  | Unqualified |  | Iref (1 bit unqualified) | −Iref/2 |
| 1 bit | Qualified | Iref/2 + Iref | Iref (1 bit unqualified) | +Iref/2 |
|  | Unqualified |  | 2Iref (2 bit unqualified) | −Iref/2 |
| 2 bit | Qualified | Iref/2 + 2Iref | 2Iref (2 bit unqualified) | +Iref/2 |
|  | Unqualified |  | 3Iref (3 bit unqualified) | −Iref/2 |

(1) The Case of Determining 0 Bit of Unqualified Bits:

First of all, determination for 0 bit of unqualified bits is described in the following. In this case, whether all the bits are successfully programmed is determined. Under such circumstance, the transistor Q8 is not required or the transistor Q8 is disabled (N=0). Apart from applying a verification voltage to the selected word line, the programming verification is similar to the normal reading operation. When all the bits are successfully programmed, the selected memory cell is not turned on, and the potentials of all the bit lines are not discharged but stayed at a pre-charged potential. Thus, the latch node SLS is at the L potential, the transistor Q1 is turned off, and the voltage of the wiring PB_UP does not change. In addition, during the verification, the JUDGEON signal is driven to the H potential, the transistor Q7 is turned on, and the wiring PB_DIS becomes a GND potential. Here, a current of ½Iref flows in the transistor Q6, so the reference voltage Vref becomes a value corresponding to a voltage drop of ½Iref. Consequently, the voltage of the wiring PB_UP is higher than the reference voltage Vref by an amount of ½Iref so the comparator CMP outputs a signal at the H potential indicating qualified.

Alternatively, when 1 bit of unqualified bits is present, the latch node SLS of one page buffer/sensing circuit 170 becomes the H potential, the transistor Q1 is turned on, the current Iref flows in the transistor Q2. Thus, the voltage of the wiring PB_UP becomes a value dropping by an amount of Iref. Consequently, the voltage of the wiring PB_UP is lower than the reference voltage Vref by ½Iref so the comparator CMP outputs a signal at the L potential indicating unqualified.

(2) The Case of Determining 1 Bit of Unqualified Bits:

In the case of determining 1 bit of unqualified bits (N=1), one transistor Q8 is configured to be operable. For example, in the case of FIG. 9, EN_1 is driven to the H potential and EN_2 is driven to the L potential. As described above, in the case where all the bits are successfully programmed, the transistor Q1 is turned off, and the voltage of the wiring PB_UP does not change. When 1 bit of unqualified bits is present, the transistor Q1 of one page buffer/sensing circuit is turned on, and the voltage of the wiring PB_UP drops by the amount of Iref. When the JUDGEON signal is driven to the H potential, the transistor Q7 is turned on, the wiring PB_DIS becomes the GND potential, and the current of ½Iref flows in the transistor Q6. Accordingly, the current of Iref flows in the transistor Q8. Thus, the reference voltage Vref becomes a value dropping by an amount of ½Iref+Iref. Consequently, the voltage of the wiring PB_UP is higher than the reference voltage Vref so the comparator CMP outputs the H potential.

Alternatively, when 2 bits of unqualified bits are present, the transistors Q1 of two page buffer/sensing circuits are turned on, and the voltage of the wiring PB_UP drops by an amount of 2×Iref. Thus, the voltage of the wiring PB_UP becomes lower than the reference voltage Vref, and the comparator CMP outputs the L potential.

(3) The Case of Determining 2 Bits of Unqualified Bits:

In the case of determining 2 bits of unqualified bits (N=2), two transistors Q8 are configured to be operable. For example, in the case of FIG. 9, EN_1 is driven to the H potential and EN_2 is driven to the H potential. As described above, when 2 bits of unqualified bits are present, the transistors Q1 of two page buffer/sensing circuits are turned on, and the voltage of the wiring PB_UP drops by the amount of 2×Iref. When the JUDGEON signal is driven to the H potential, the transistor Q7 is turned on, the wiring PB_DIS becomes the GND potential, and the current of ½Iref flows in the transistor Q6. Accordingly, the current of 2×Iref flows in the two transistors Q8. Thus, the reference voltage Vref becomes a value dropping by an amount of ½Iref+2×Iref. Consequently, the voltage of the wiring PB_UP is higher than the reference voltage Vref so the comparator CMP outputs the H potential.

Alternatively, when 3 bits of unqualified bits are present, the transistors Q1 of three page buffer/sensing circuits are turned on, and the voltage of the wiring PB_UP drops by an amount of 3×Iref. Thus, the voltage of the wiring PB_UP becomes lower than the reference voltage Vref, and the comparator CMP outputs the L potential.

As described above, the determination circuit can determine whether the unqualified bits are suspectedly qualified by comparing the voltage generated by the reference current corresponding to the number of unqualified bits with the reference voltage generated by the reference current corresponding to the number of the unqualified bits plus +½ reference current.

The determination circuit 200 used in the scheme for determination of suspectedly qualified may also be used as a detecting circuit for detecting a number Ns of failures among NAND strings of the selected block. For example, the number Ns of the failures among the NAND strings is detected in the erasing operation of the selected block or detected in the programming operation of the selected page of the selected block. For example, in conventional art, the selected block is erased under the premise that all the NAND strings of the selected block are qualified. That is, an erasing verification voltage is applied to all the word lines in the selected block, and a reverse reading is performed by supplying Vcc from the common source line to the NAND strings. The erasing verification is qualified if the read nodes of all the bit lines are Vcc or at the H potential, and the erasing verification is unqualified as long as one bit line is 0V or at the L potential.

On the other hand, in the present embodiment, the number Ns of the failures among the NAND strings of the selected block is detected by the detecting circuit 200. If the number Ns of the failures is less than or equal to a fixed number, the block may be directly used as a block usable for programming rather than being considered to be unusable as a bad block.

Figure 10:
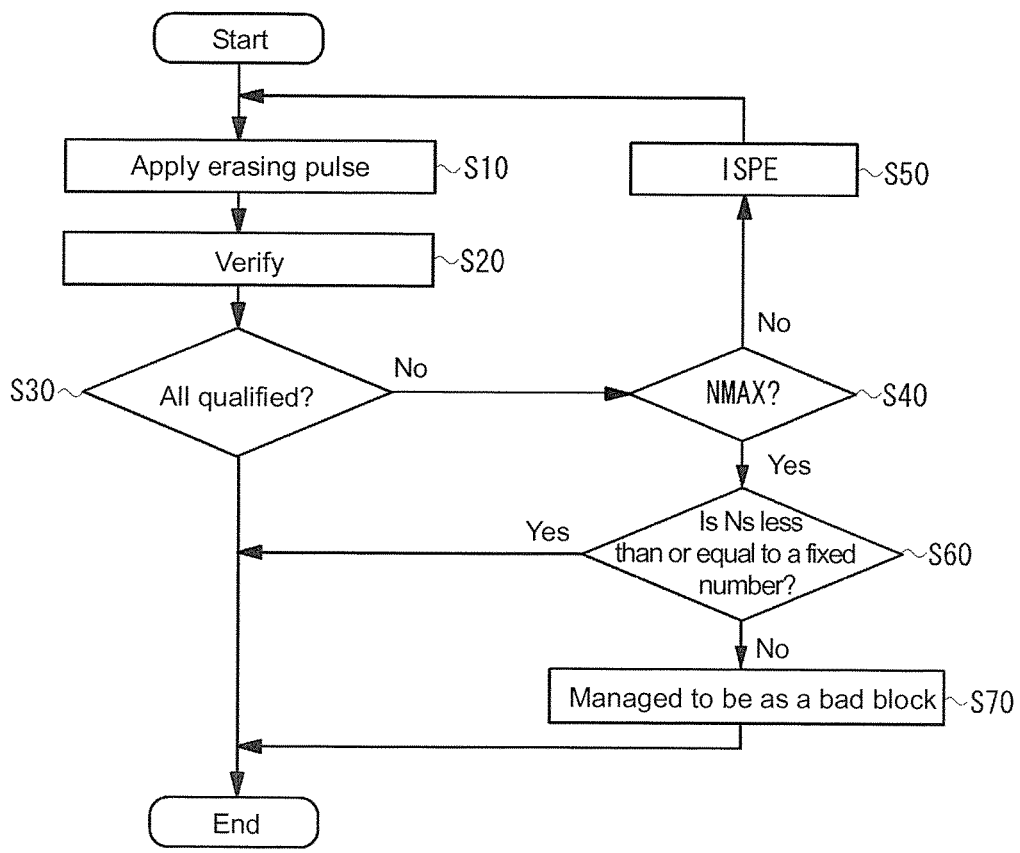
FIG. 10 is a flowchart illustrating an erasing operation according to an embodiment of the invention.

FIG. 10 illustrates a process in the erasing operation of the present embodiment. The process of step S10 to step S50 is identical to the process shown in FIG. 1. Whether a number of times of applying the erasing pulse reaches a permissible maximum number of times of applying the erasing pulse (i.e., NMAX) is determined (S40). If yes, whether a number Ns of the failures among the NAND strings is less than or equal to a fixed number is further determined (S60). The fixed number is determined based on the number Ncc of bits correctable by the ECC circuit 130 or the permissible maximum number Np of bits that can be determined as suspectedly qualified (e.g., in a relationship of the fixed number≤Np≤Ncc). If the number Ns of the failures among the strings is less than or equal to the fixed number, the erasing operation ends (e.g., the block may be used later). Alternatively, if the number Ns of the failures among the strings exceeds the fixed number, an external controller is informed of a status of erasing failure, and the block is managed to be unusable as a bad block (S70).

Next, a method of detecting the number Ns of the failures among the NAND strings is described in the followings. The number of the failures among the NAND strings is detected by using the page buffer/sensing circuit 170 and the determination circuit 200 connected thereto, as shown in FIG. 8. For example, two transistors Q8 are connected in the determination circuit 200 and connected in series with optional transistors Q10 and Q11, as shown in FIG. 9.

(1) Detection for 0 Bit of the Failures Among Strings:

The enable signal EN_1 and the enable signal EN_2 are driven to the L potential by the controller 150, and the transistor Q8_1 and the transistor Q8_2 are configured to be inoperable. Here, the reverse reading of the selected block is performed. If all the NAND strings are successfully erased (the threshold values of all the memory cells fall within the distribution "0"), the read nodes SNS of the all the page buffer/sensing circuits 170 are at the H potential, the transistor Q1 is turned off, and the comparator CMP outputs the H potential. Such output indicates that the number Ns of the failures among the strings in the erasing operation of the selected block is zero. Alternatively, if 1 bit of the NAND string has erasing failure (the threshold values of the memory cell do not all fall within the distribution of "0"), the read node SNS of the page buffer/sensing circuit 170 is at the L potential, the transistor Q1 is turned on, the voltage of the wiring PB_UP is lower than the reference voltage Vref by ½Iref, and the comparator CMP outputs the L potential. Such output indicates that the number Ns of the failures among the strings in the erasing operation of the selected block is 1 bit.

(2) Detection for 1 Bit of the Failures Among Strings:

One of the enable signal EN_1 and the enable signal EN_2 is driven to the H potential by the controller 150, and one of the transistor Q8_1 and the transistor Q8_2 is configured to be operable. In the reverse reading, the comparator CMP outputs H potential when 1 bit of the failures among the NAND strings is present, and the comparator CMP outputs the L potential when 2 bits of the failures are present.

(3) Detection for 2 Bits of the Failures Among Strings:

The enable signal EN_1 and the enable signal EN_2 are both driven to the H potential by the controller 150, and both of the transistor Q8_1 and the transistor Q8_2 are configured to be operable. In the reverse reading, the comparator CMP outputs H potential when 2 bits of the failures among the NAND strings is present, and the comparator CMP outputs the L potential when 3 bits of the failures are present.

Next, the programming operation of the present embodiment is described in the following. In the programming operation of the present embodiment, the number Ns of the failures among the NAND strings is detected before the programming starts, and the number N of unqualified bits for determination of suspectedly qualified is determined based on the number Ns of the failures being detected. In the erasing operation of the selected block, the NAND strings with erasing failure contain the memory cells of the data "0". When aforesaid selected block is used for programming, the bit lines of the NAND strings with the failures are determined as qualified in the programming verification regardless of whether the input data Di is "0" or "1", and thus whether the input data Di is correctly programmed cannot be ensured. Therefore, in the case where the NAND strings include the failures, the number of unqualified bits to be determined as suspectedly qualified must be reduced in correspondence with the number of the number Ns of the failures.

Figure 11:
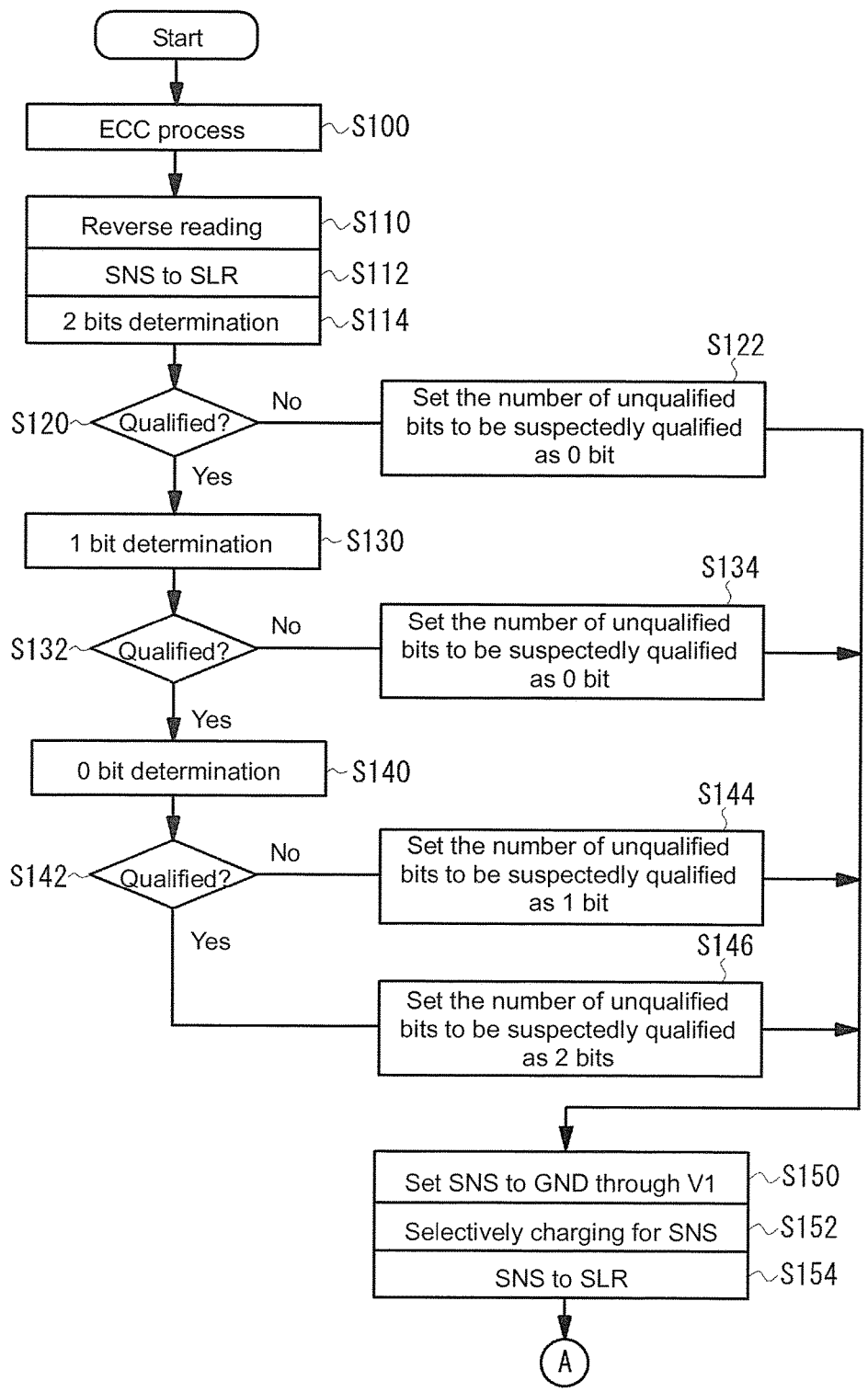
FIG. 11 is a flowchart illustrating a programming operation according to an embodiment of the invention.
Figure 12:
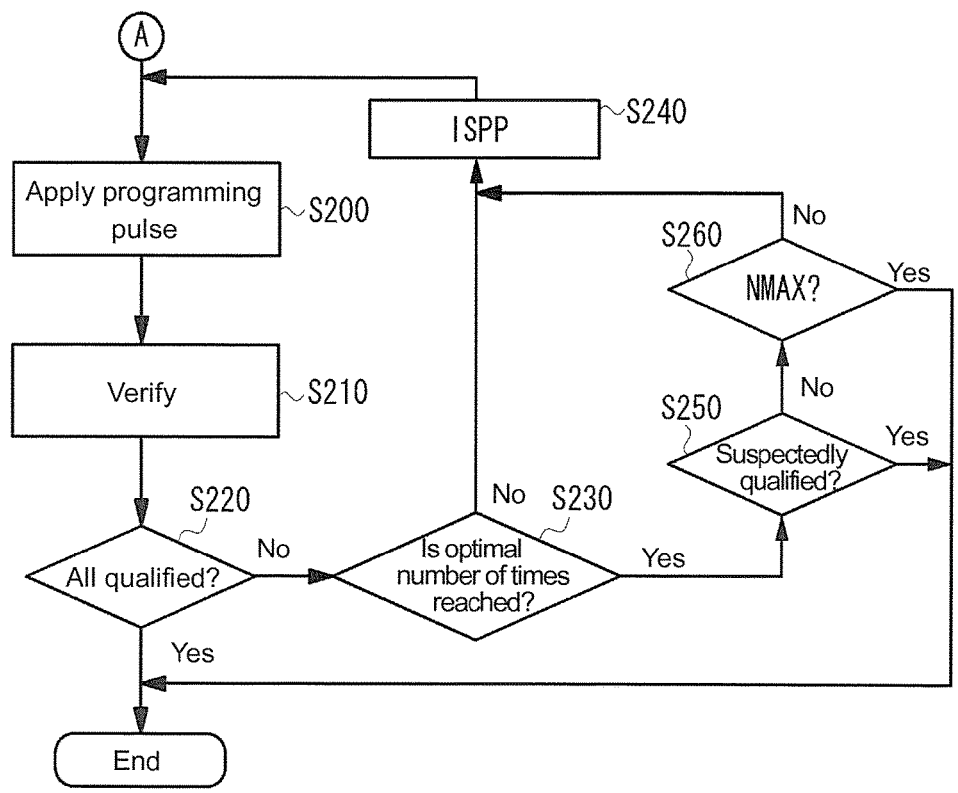
FIG. 12 is a flowchart illustrating a programming operation according to an embodiment of the invention.

FIG. 11 and FIG. 12 are flowcharts illustrating the programming operation of the present embodiment. After receiving a program command, address information and data Di via the input-output buffer 120, the controller 150 starts a programming sequence. The input data Di is loaded to the page buffer/sensing circuit 170, and an ECC process is then performed on the input data Di by the ECC circuit 130.

When the ECC process ends before the programming starts, the number Ns of the failures among the NAND strings is detected. First of all, a reverse reading is performed by using sector as a unit by the page buffer/sensing circuit 170 shown in FIG. 8. Table 3 and Table 4 are tables showing logical values of the respective nodes when the input data are "0" and "1" in different cases where the NAND strings have the failures and have no failures.

TABLE 3

| Node | SLR | VG | SNS | SLR | CMP |
|---|---|---|---|---|---|
| String | Data input | DIN latch | Reverse reading | SNS→SLR | Determined as |
| Failures | 0 | 0 | 0 | 0 | Unqualified |
| No Failures | 0 | 0 | 1 | 1 | Qualified |
| Failures | 1 | 1 | 0 | 0 | Unqualified |
| No Failures | 1 | 1 | 1 | 1 | Qualified |

| CMP | SNS | SNS | SLR | |
|---|---|---|---|---|
| Determined as | SNS GND | Selectivity charging | SNS→SLR | PGM |
| Unqualified | 0 | 0 | 0 | Write |
| Qualified | 0 | 0 | 0 | Write |
| Unqualified | 0 | 1 | 1 | Write inhibit |
| Qualified | 0 | 1 | 1 | Write inhibit |

TABLE 4

| Node | SLR | SNS | VG | SLR | SNS |
|---|---|---|---|---|---|
| String | Data input | Reverse reading | SLR→VG | SNS→SLR | SNS GND |
| Failures | 0 | 0 | 0 | 0 | 0 |
| No Failures | 0 | 1 | 0 | 1 | 0 |
| Failures | 1 | 0 | 1 | 0 | 0 |
| No Failures | 1 | 1 | 1 | 1 | 0 |

| SNS | SNS | CMP | SLR | |
|---|---|---|---|---|
| SNS GND | Selectivity charging | Determined as | SNS→SLR | PGM |
| 0 | 0 | Unqualified | 0 | Write |
| 0 | 0 | Qualified | 0 | Write |
| 0 | 1 | Unqualified | 1 | Write inhibit |
| 0 | 1 | Qualified | 1 | Write inhibit |

When the data Di to be programmed are loaded to the latch circuit, the latch node SLR is at a logic potential corresponding to the input data. Next, in a fixed period when the transistor DTG is turned on, the charges of the latch node SLR are transmitted to the node VG and held by the node VG. In other words, the node VG temporarily holds the data to be programmed during the reverse reading. Next, the reverse reading is performed (S110). The reverse reading is to supply, for example, the Vcc voltage from the common source line connected to the selected block to the NAND strings. If the NAND strings have no failures, the threshold values of the memory cells constituting the NAND strings are "1", the NAND strings are turned on and the read node SNS becomes the H potential. Alternatively, if the NAND strings have the failures, the threshold value of at least one of the memory cells constituting the NAND string is not "1". Thus, the NAND strings are not turned on and the read node SNS becomes the L potential. Next, in a fixed period when the transistor BLCD is turned on, the charges of the read node SNS are transmitted to the latch node SLR (S112). When the latch node SLR is at the H potential, the latch node SLS becomes the L potential and the transistor Q1 is turned off. Conversely, when the latch node SLR is at the L potential, the latch node SLS becomes the H potential and the transistor Q1 is turned off.

Here, when the determination circuit 200 determines 2 bits of unqualified bits at the maximum to be suspectedly qualified as described above, the two transistors Q8_1 and Q8_2 are connected in the determination circuit 200 as shown in FIG. 9. The controller 150 configures the two transistors Q8_1 and Q8_2 to be operable through the enable signal EN_1 and the enable signal EN_2, so as to determine whether the number Ns of the failures among the NAND strings is 2 bits (S114). If the output of the comparator CMP is at the L potential (S120), the number Ns of the failures among the strings is 3 bits. Under such circumstance, the controller 150 sets the number of unqualified bits to be suspectedly qualified as 0 bit (N=0) (S122). That is, the enable signal EN_1 and the enable signal EN_2 are driven to the L potential, and the transistor Q8_1 and the transistor Q8_2 are configured to be inoperable (S122). Accordingly, in the programming verification, whether all the bits of the selected page are qualified is determined.

If the output of the comparator CMP is the H potential, the number Ns of the failures among the strings is less than or equal to 2 bits. Under such circumstance, whether the number Ns of the failures among the strings is 1 bit is determined next (S130). The controller 150 can determine whether the number of failures is 1 bit by configuring any one of the transistor Q8_1 and the transistor Q8_2 to be operable. If the output of the comparator CMP is the L potential (S132), the number Ns of the failures among the strings is 2 bits. Under such circumstance, the controller 150 also sets the number of unqualified bits to be suspectedly qualified as 0 bit (N=0) (S134).

If the output of the comparator CMP is the H potential, the number Ns of the failures among the strings is less than or equal to 1 bits. Under such circumstance, whether the number Ns of failures among the strings is 0 bit is determined next (S140). The controller 150 can determine whether the number of failures is 0 bit by configuring both of the transistor Q8_1 and the transistor Q8_2 to be inoperable. If the output of the comparator CMP is at the L potential (S142), the number Ns of the failures among the strings is 1 bit. Under such circumstance, the controller 150 sets the number of unqualified bits to be suspectedly qualified as 1 bit (N=1) (S144). That is, one of the enable signal EN_1 and the enable signal EN_2 is set to the H potential by making any one of the transistor Q8_1 and the transistor Q8_2 to be operable.

If the output of the comparator CMP is the H potential, the number Ns of the failures among the strings is 0 bit. Under such circumstance, the controller 150 sets the number of unqualified bits to be suspectedly qualified as 2 bits (N=2) (S146). That is, both of the enable signal EN_1 and the enable signal EN_2 are set to the H potential by making both of the transistor Q8_1 and Q8_2 to be operable.

When the setting of the number N of unqualified bits to be suspectedly qualified in correspondence with the number Ns of the failures among the NAND strings is completed, the data held by the node VG is then restored to the latch node SLR. First of all, after the voltage supplier V1 is set to GND and the read node SNS is set to GND by turning on the transistor BLPRE in the fixed period (S150), the voltage supplier V2 is set from 0V to Vdd so the transistor REG is turned on in the fixed period. If the voltage supplier V2 changes to Vdd when the node VG is at the H potential, the potential at the node VG is further increased through a bootstrap voltage, the corresponding transistor is strongly turned on, and the read node SNS is charged to the H potential (S152). On the other hand, under the circumstance where the node VG is at the L potential, because the corresponding transistor is not turned on, the read node SNS maintains at the L potential. Next, the charges of the read node SNS are transmitted to the latch node SLR, the input data is restored (S154), and then programming operation starts.

After the input data is restored, the programming starts according to the input data. As shown in FIG. 12, the word line select circuit 160 selects the word lines of the selected block, and the sensing circuit applies a voltage corresponding to the input data to the bit lines and applies a programming pulse to the selected page (S200). Next, a programming verification is performed (S210). If the result of the verification is that all the bits of the selected page are qualified, the programming ends (S220). Alternatively, if all the bits are unqualified, the controller 150 determines whether a number of times of applying the programming pulse reaches an optimal number Nop of times (S230). Here, the optimal number Nop of times is a value less than the permissible maximum number NMAX of times of applying the programming pulse. Preferably, such value should be a minimum number of times of applying the programming pulse under the circumstance where the memory cells being determined as programming failures. For example, if a permissible maximum time of the programming is 700 μs and a time required to apply the programming for one time is set to 50 μs, NMAX=700 μs or NMAX=14 times. The optimal number Nop of times may be determined based on the number of times of applying the programming pulse used when determining the memory cells as being successfully programmed. For example, when an average number Nav of times of applying the programming pulse to the successfully programmed memory cells is calculated by using a statistical method, the optimal number Nop may be set as Nop=Nav. The optimal number Nop may be set by, for example, commands received from the external controller, and the set value is held by a register of the controller 150.

When the number of times of applying the programming pulse does not reach the optimal number Nop of times (S230), the controller 150 applies a programming pulse that is greater than the previous one by ΔV to the selected page according to Incremental Step Programming Pulse (ISPP) (S240). Alternatively, if the number of times of applying the programming pulse reaches the optimal number Nop of times (S230), the controller 150 performs the step of determining whether the selected page is suspectedly qualified (S250). As described above, the number N of unqualified bits to be considered as suspectedly qualified is less than or equal to the maximum number Ncc correctable by the ECC. If the number of unqualified bits in the verification (i.e., the number of the unqualified bits actually generated in the selected page) is less than or equal to the number N of unqualified bits for making determination of suspectedly qualified, unqualified bits are determined as suspectedly qualified (S250). When determination of suspectedly qualified is made, the programming operation ends and the unqualified bits with the failures "0" are directly stored to the selected page.

Alternatively, when determination of suspectedly qualified cannot be made (S250), the controller 150 determines whether the number of times of applying the programming pulse reaches NMAX (S260). If not, the programming pulse is applied to the selected page according to ISPP (S240 and S200). Under the circumstance where the number of times of applying the programming pulse reaches NMAX, an external controller is informed of a status of programming failure, and the block including the selected block is managed as a bad block. Under such circumstance, identification information of the bad block is stored to the area 311 of the spare area.

Here, when the number Ns of the failures among the NAND strings in the selected block is 2 bits, as described above, the number of unqualified bits to be determined as suspectedly qualified is 0 bit. Therefore, in the flow of FIG. 12, the determination of suspectedly qualified is, in fact, not performed (S250). The failures among the NAND strings refer to the memory cells with the threshold value not being "1", which are unqualified in the reverse reading but are qualified in the programming verification. That is, regardless of what the data to be programmed is, the programming verification of the NAND strings having the failures is "0", namely it is qualified. Therefore, when the NAND strings with the failures is included in the selected block, the programming verification may potentially include the error corresponding to the number Ns of the failures among the NAND strings (when the data to be programmed to the NAND strings is "1"), an inconsistency (error) corresponding to the number Ns of the failures among the strings may occur when comparing the programming data with the data read from the selected page. Because said error must be corrected through the ECC circuit 130, correspondingly, the proportion of the unqualified bits occupied by those determined as suspectedly qualified by the determination circuit 200 is reduced.

As described above, according to the present embodiment, it is set to detect the number of the failures among the NAND strings of the selected block. As such, if the number Ns of the failures among the NAND strings is less than or equal to the number of bits correctable by the ECC circuit, the blocks counted as the bad block in prior art is now usable so the utilization efficiency and production yield may both be improved.

The preferable embodiment of the invention had been described in detail above, but the invention is not limited to a specific embodiment. It will be apparent to those skilled in the art that various modifications and variations can be made to the structure of the present invention without departing from the scope or spirit of the invention.

What is claimed is:

1. An erasing method of semiconductor storage device, comprising steps of:
    applying an erasing pulse to a selected block;
    detecting a number of failures among NAND strings of the selected block when the selected block is unqualified in an erasing verification and a number of times of applying the erasing pulse reaches a predetermined number of times; and
    completing the erasing in a state of the selected block to be usable when the number of the failures among the NAND strings is less than or equal to a fixed number, and managing the selected block to be unusable as a bad block when the number of the failures exceeds the fixed number.

2. The erasing method of semiconductor storage device according to claim 1 wherein the fixed number is less than or equal to a number of bits correctable through an error checking/correcting process.

3. A programming method of semiconductor storage device, comprising steps of:
    detecting a number of failures among NAND strings of a selected block;
    determining a permissible number of unqualified bits in a programming verification based on the number of the failures among the NAND strings being detected;
    applying a programming pulse to a selected page of the selected block; and performing the programming verification on the selected page based on the permissible number of unqualified bits, wherein the programming verification is determined as suspectedly qualified when the selected page having a number of bits with programming failure less than or equal to the permissible number of unqualified bits.

4. The programming method of semiconductor storage device according to claim 3, wherein the permissible number of unqualified bits is less than or equal to a number of bits correctable through an error checking/correcting process.

5. The programming method of semiconductor storage device according to claim 3, wherein the permissible number of unqualified bits correspondingly decreases when the number of the failures among the NAND strings increases.

6. The programming method of semiconductor storage device according to claim 3, wherein the step of detecting the number of the failures among the NAND strings of the selected block comprises: performing a step of reverse reading, wherein the step of reverse reading is to read by applying a voltage from a common source line of the selected block to the NAND strings.

7. The programming method of semiconductor storage device according to claim 3, wherein the programming method further comprises: performing an error checking/correcting process on data to be programmed, and correcting an error caused by the failures among the NAND strings through the error checking/correcting process when reading the data.

8. A semiconductor storage device, comprising:
a memory array, comprising a plurality of NAND strings;
a plurality of output circuits, connected to the NAND strings of the memory array through a bit line, and outputting whether the NAND strings include failures;
a detecting circuit, connected to the plurality of the output circuits, and detecting a number of the failures among the NAND strings of a selected block; and
an erasing circuit, for erasing the selected block, wherein when the selected block is unqualified in an erasing verification and a number of times of applying an erasing pulse reaches a predetermined number of times, the erasing circuit completes the erasing in a state of the selected block to be usable when the number of the failures among the NAND strings is less than or equal to a fixed number, and the erasing circuit manages the selected block to be unusable as a bad block when the number of the failures exceeds the fixed number.

9. The semiconductor storage device according to claim 8, wherein the detecting circuit comprises: a first circuit, generating a plurality of detection voltages corresponding to whether the NAND strings include the failures outputted by the plurality of the output circuits; a second circuit, generating a reference voltage; and a comparison circuit, comparing the detection voltages with the reference voltage, and the comparison circuit detecting the number of the failures among the NAND strings connected to the plurality of the output circuits.

10. The semiconductor memory device according to claim 8, wherein the semiconductor memory device further comprises a reverse reading circuit for performing a reverse reading on the plurality of NAND strings of the selected block by applying a voltage from a common source line of the selected block to the NAND strings and applying a verification voltage to all pages of the selected block, wherein the plurality of output circuits outputs whether the NAND strings include the failures based on a read result of the reverse reading circuit.

11. The semiconductor storage device according to claim 8, wherein the semiconductor memory device further comprises a programming circuit for programming a selected page of the selected block, and the programming circuit performing a programming verification on the selected page based on a permissible number of unqualified bits, wherein the permissible number of unqualified bits is set based on the number of the failures among the NAND strings detected by the detecting circuit.

12. The semiconductor storage device according to claim 11, wherein the semiconductor memory device further comprises an error checking/correcting circuit for performing an error checking/correcting process on data to be programmed and data read from the memory array, wherein the permissible number of unqualified bits is less than or equal to a number of bits correctable by the error checking/correcting circuit.

13. The semiconductor storage device according to claim 8, wherein the plurality of output circuits comprises a page buffer/sensing circuit.

* * * * *